Figure 1:
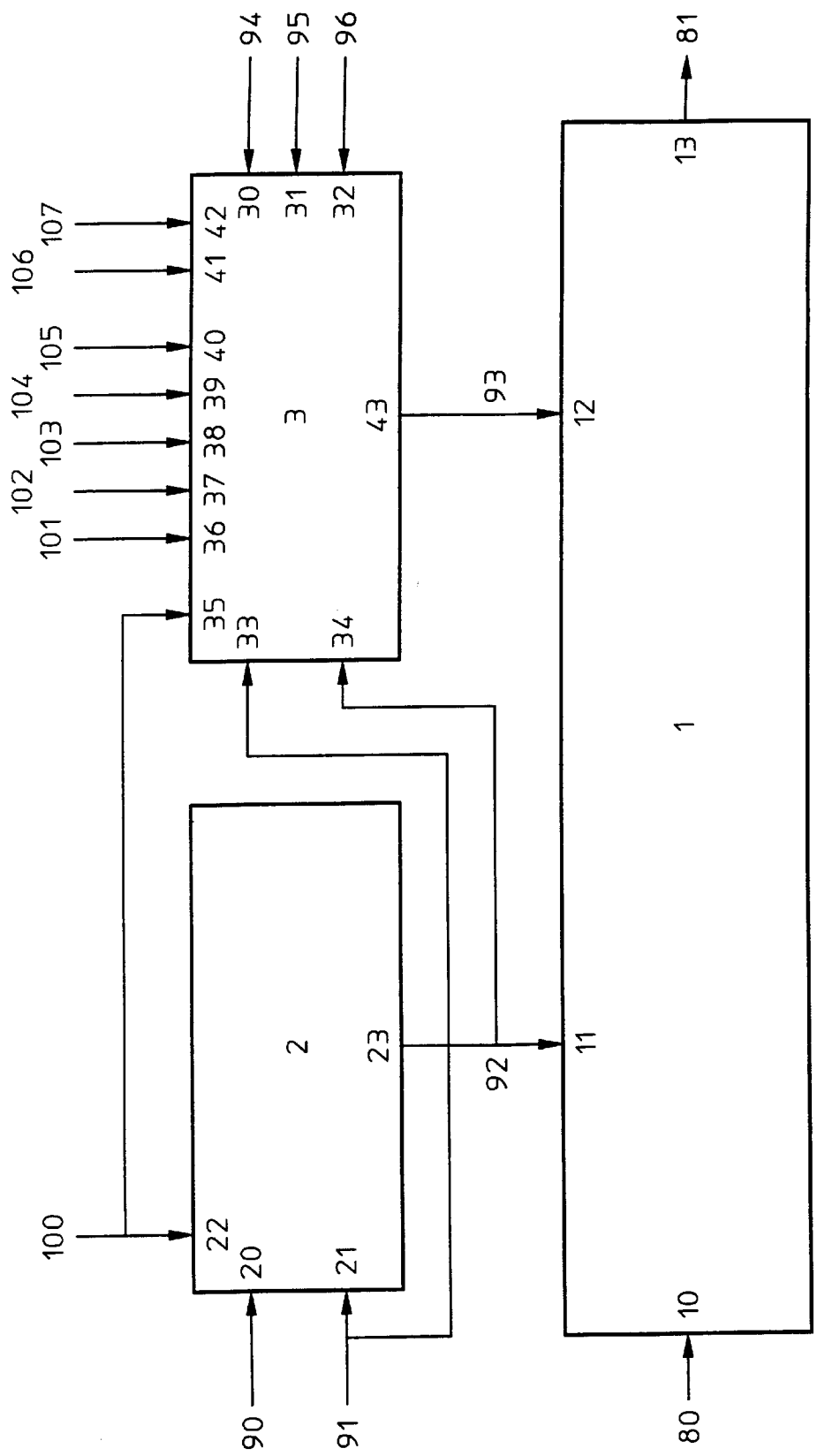

United States Patent [19]
Koppelmans et al.

[11] Patent Number: 5,822,789
[45] Date of Patent: Oct. 13, 1998

[54] VIDEO MEMORY ARRANGEMENT

[75] Inventors: Johannes Franciscus Aloysius Koppelmans, The Hague; Arthur Meijboom, Schiedam, both of Netherlands

[73] Assignee: Koninklijke PTT, Netherlands

[21] Appl. No.: 779,200

[22] Filed: Jan. 6, 1997

Related U.S. Application Data

[63] Continuation of Ser. No. 510,485, Aug. 2, 1995, abandoned.

[30] Foreign Application Priority Data

Aug. 11, 1994 [NL] Netherlands ............................ 9401301

[51] Int. Cl.⁶ ...................................................... G06F 9/26
[52] U.S. Cl. .................................. 711/213; 711/2; 711/5; 711/219; 711/220
[58] Field of Search ..................... 711/2, 5, 220, 711/213, 219, 217; 358/322

[56] References Cited

U.S. PATENT DOCUMENTS

| | | | |
|---|---|---|---|
| 4,584,639 | 4/1986 | Hardy | 395/650 |
| 4,623,244 | 11/1986 | Andrews et al. | 355/24 |
| 4,644,495 | 2/1987 | Crane | 364/900 |
| 4,757,443 | 7/1988 | Hecker et al. | 345/10 |
| 5,237,432 | 8/1993 | Calarco et al. | 358/451 |
| 5,255,382 | 10/1993 | Pawloski | 711/2 |
| 5,291,275 | 3/1994 | Lumelsky | 348/441 |
| 5,353,123 | 10/1994 | Lee | 358/322 |

*Primary Examiner*—Eddie P. Chan
*Assistant Examiner*—Than V. Nguyen
*Attorney, Agent, or Firm*—Michaelson & Wallace; Peter L. Michaelson; John C. Pokotylo

[57] ABSTRACT

By providing a digital video memory arrangement with first and second address generating circuits, digital video signals can be written at a first location of a non-mechanical memory and (almost) immediately read out from a second location of the non-mechanical memory, with the reading out both being capable of featuring backward and forward jumps. As a consequence of a coupling between the first and the second address generating circuits it becomes impossible to, on the one hand, unjustly pass with jumping in the read signal the running or stopped write signal and, on the other hand, unjustly pass with the running read signal the stopped write signal. To this end the second address generating circuits dispose over determining circuits for determining, in response to at least the write signal and the read signal, a permitted address jump.

13 Claims, 2 Drawing Sheets

VIDEO MEMORY ARRANGEMENT

CROSS REFERENCE TO RELATED APPLICATION

This application is a continuation of patent application entitled "Video Memory Arrangement", Ser. No. 08/510,485, filed on Aug. 2, 1995, now abandoned.

BACKGROUND OF THE INVENTION

The invention relates to a video memory arrangement, provided with a non-mechanical memory comprising:

a data input for receiving a digital video signal a data output for generating a digital video signal, and an address input for receiving a write signal for addressing a write location for the digital video signal which is to be received via the data input, and receiving a read signal for addressing a read location for the digital video signal which is to be generated via the data output.

Such a video memory is commonly known. The non-mechanical memory relates to, for example, a so-called Dual Ported Random Access Memory, or DPRAM, which is provided with two data inputs and two data outputs and with two address read inputs and two address write inputs, with for example one of the data input/outputs being constantly switched as a data input and the other as a data output, and with for example one of the address read/write inputs being constantly switched as an address write input and the other as an address read input. A so-called Random Access Memory or RAM could also be used as a nonmechanical memory, which is provided with one data input/output, which, via a logic circuit, is alternatingly used as a data input and as a data output, and with one address write/read input which, via a logic circuit, is alternatingly used as an address write input and as an address read input. By supplying the write signal to the address write input of the DPRAM or, via a logic circuit, to the address read/write input of the RAM, a write location is addressed for the digital video signal which is to be received via the data input. Said digital video signal, for example, is a coded digital video signal which arrives at a rate of 1.5 Mbit/s (standard CDI quality). In case a whole 10 minutes, or 600 seconds, of video information are to be stored thereof, 900 Mbits of memory space are needed, corresponding with 15 memory chips of 64 Mbits. By supplying the read signal to the address read input of the DPRAM or, via a logic circuit, to the address read/write input of the RAM, a read location is addressed for the digital video signal which is stored in the non-mechanical memory and which is to be generated via the data output.

Such a video memory arrangement, inter alia, has the disadvantage that it ha s to be registered in a separate memory, where the various parts with certain video information are situated in the non-mechanical memory, in behalf of the read signal which is to be generated.

SUMMARY OF THE INVENTION

The object of the invention is, inter alia, to provide a video memory arrangement of the kind as referred to in the preamble, with which it is no longer necessary, in behalf of the read signal which is to be generated, that it is registered in a separate memory where the various parts with certain video information are situated.

Thereto, the video memory arrangement in accordance with the invention is characterised, in that the video memory arrangement is further provided with first address generating means coupled to the address input for generating the write signal, in response to at least one control signal which is to be derived from the digital video signal which is to be received, and second address generating means coupled to the address input for generating the read signal, in response to at least the write signal.

By generating the write signal via the first address generating means, in response to at least one control signal which is to be derived from the digital video signal which is to be received, and by generating the read signal, via the second address generating means, in response to at least the write signal, a coupling is arranged between the read signal and the write signal. Since the read signal is derived from, inter alia, the write signal, registering the locations in the non-mechanical memory where the various parts with certain video information are stored is no longer necessary. Deriving the control signal from the digital video signal which is to be received in this context occurs in a manner known by those skilled in the art, as has been described in various recommendations.

The invention is, inter alia, based on the insight that the write signal determines where the various parts with certain video information are stored in the non-mechanical memory, and that the read signal can be generated in a simple and non-complicated manner by arranging a coupling between the read signal and the write signal. The problem of generating in a complicated manner the read signal is therefore solved by the coupling being arranged between the read signal and the write signal.

It is of course also possible to implement the first address generating means in duplicate, with the one write signal which is to be generated by the one first address generating means being supplied to the address input of the non-mechanical memory, and with the other write signal which is to be generated by the other first address generating means being supplied to the second address generating means. In this case, the other write signal is indeed not supplied to the address input of the non-mechanical memory in a literal manner, but yet in a figurative manner due to the fact that the other write signal is at least fairly identical to the one write signal. Furthermore, another solution exists for the problem of generating the read signal in a complicated manner, e.g. generating at random said read signal. It will be understood that such a solution is not preferable.

A first embodiment of the video memory arrangement in accordance with the invention is characterised, in that the first address generating means are provided with counting means for generating in a cyclic manner subsequent counting values, said counting means comprising a counting control input for receiving the control signal.

By using the counting means for generating subsequent counting means in a cyclic manner, the video memory arrangement obtains a cyclic nature; with, as soon as the non-mechanical memory has been completely loaded with video information, the loaded oldest video information will be overwritten first with new video information, and the loaded most recent video information will be overwritten last with new video information. When the control signal which is to be derived from the digital video signal which is to be received is supplied to the counting control input of the counting means, the counting means are synchronous with the digital video signal which is to be received.

A second embodiment of the video memory arrangement in accordance with the invention is characterised, in that the counting means comprise a load control input for receiving a load control signal for loading the counting means with a load value signal which is to be offered at a load value input of the counting means.

By supplying the load control signal to the load control input of the counting means for loading the counting means with the load value signal which is to be offered to the load value input of the counting means, video information can be stored from an initial write address, with said initial write address being adjustable with the load value signal.

A third embodiment of the video memory arrangement in accordance with the invention is characterised, in that the second address generating means are provided with determining means for determining, in response to at least the write signal and the read signal, a permitted address jump.

By providing the second address generating means with determining means for determining, in response to at least the write signal and the read signal, a permitted address jump, video information can be read out from an initial read address, with jumping to said initial read address possibly carried out in a direct manner provided that the address jump which is required therefor is permitted.

A fourth embodiment of the video memory arrangement in accordance with the invention is characterised, in that the determining means are provided with first calculating means for calculating, in response to at least the write signal and the read signal, an available address space, second calculating means for calculating, in response to at least the read signal, a desired address jump, third calculating means for calculating, in response to at least the write signal, an extreme address value, and selecting means for selecting, in dependence of at least the available address space, the desired address jump or the extreme address value as a permitted address jump.

By selecting, with the help of the selecting means in dependence of at least the available address space which is calculated with the first calculating means, either the desired address jump which is calculated with the second calculating means or the extreme address value (maximum possible address jump) which is calculated with the third calculating means as a permitted address jump, the determining means are realised in a simple manner.

A fifth embodiment of the video memory arrangement in accordance with the invention is characterised, in that the first calculating means comprise first forward calculating means which are provided with a first input for receiving the write signal, a second input for receiving the read signal, and an output for generating a forward address space signal which corresponds with the write signal minus the read signal and modulo a memory size signal, with the second calculating means comprising second forward calculating means which are provided with a first input for receiving the read signal, a second input for receiving a forward jump size signal, and an output for generating a first forward address jump signal which corresponds with the read signal plus the forward jump size signal modulo the memory size signal, with the third calculating means comprising third forward calculating means which are provided with a first input for receiving the write signal, a second input for receiving a first margin signal, and an output for generating a maximum address value signal which corresponds with the write signal minus the first margin signal and modulo the memory size signal, with the determining means comprising forward comparing means which are provided with a first input for receiving the forward jump size signal, a second input for receiving the forward address space signal, and an output for generating a forward output signal of one type if the forward jump size signal is larger than or equal to the forward address space signal and for generating a forward output signal of other type in other cases, and with the selecting means comprising forward multiplexing means which are provided with a control input for receiving the forward output signal of one type or of other type, a first input for receiving the first forward address jump signal, a second input for receiving the maximum address value signal, and an output for generating a second forward address jump signal.

Thus, a forward permitted address jump is calculated in a simple manner.

A sixth embodiment of the video memory arrangement in accordance with the invention is characterised, in that the first calculating means comprise first backward calculating means which are provided with a first input for receiving the memory size signal, a second input for receiving the forward address space signal, and an output for generating a backward address space signal which corresponds with the memory size signal minus the forward address space signal, with the second calculating means comprising second backward calculating means which are provided with a first input for receiving the read signal, a second input for receiving a backward jump size signal, and an output for generating a first backward address jump signal which corresponds with the read signal minus the backward jump size signal modulo the memory size signal, with the third calculating means comprising third backward calculating means which are provided with a first input for receiving the write signal, a second input for receiving a second margin signal, and an output for generating a minimum address value signal which corresponds with the write signal plus the second margin signal and modulo the memory size signal, with the determining means comprising backward comparing means which are provided with a first input for receiving the backward jump size signal, a second input for receiving the backward address space signal, and an output for generating a backward output signal of one type if the backward jump size signal is larger than or equal to the backward address space signal and for generating a backward output signal of other type in other cases, with the selecting means comprising backward multiplexing means which are provided with a control input for receiving the backward output signal of one type or of other type, a first input for receiving the first backward address jump signal, a second input for receiving the minimum address value signal, and an output for generating a second backward address jump signal, and, with the determining means comprising further selecting means which are provided with a further control input for receiving a selecting signal of one type or of other type, a further first input for receiving the second forward address jump signal, a further second input for receiving the second backward address jump signal, and a further output for generating the second forward address jump signal, in response to the selecting signal of one type, and for generating the second backward address jump signal, in response to the selecting signal of other type.

Thus, a backward permitted address jump is calculated in a simple manner, with either the second forward address jump signal being generated, in response to the selecting signal of one type, or the second backward address jump signal being generated, in response to the selecting signal of other type, by using the further selecting means.

A seventh embodiment of the video memory arrangement in accordance with the invention is characterised, in that the second address generating means comprise further counting means which are provided with a further output for generating a subsequent read signal, a further counting control input for receiving a further counting control signal and for modifying, in response to the further counting control signal, a counting position and supplying the modified counting position to the further output, a further load control input for receiving a further load control signal, a further load value input coupled ( * which is coupled etc?) to an output of at least one of the selecting means for receiving a further load value signal and for loading, in response to the further load control signal, the further counting means with said further load value signal and supplying said further load value signal to the further output.

By using the further counting means the subsequent read signal is generated, with the counting position being modified, in response to the further counting control signal, and supplied to the further output, and with the further load value signal being loaded, in response to the further load control signal, and supplied to the further output. Thus, on the one hand, a subsequent read signal can be generated which is equal to the old read signal and increased by the value one and modulo the memory size; and on the other hand, a subsequent read signal can be generated as a consequence of a certain address jump.

An eighth embodiment of the video memory arrangement in accordance with the invention is characterised, in that the second address generating means comprise still further selecting means which are provided with a still further control input for receiving a further selecting signal of one type or of other type, a still further first input for receiving a still further load value signal, a still further second input coupled to the further output of the further selecting means, and a still further output coupled to the further load value input of the further counting means.

By using the still further selecting means, video information can be read out from an initial read address, with said initial read address being adjustable with the still further load value signal.

A ninth embodiment of the video memory arrangement in accordance with the invention is characterised, in that the second address generating means comprise combining means which are provided with an output for generating the further load control signal, a first input for receiving the selecting signal, a second input for receiving the further selecting signal, and a third input for receiving a still further selecting signal.

By using the combining means, a backward jump can be made (via the selecting signal), an initial read address value can be loaded (via the further selecting signal), and a forward jump can be made (via the still further selecting signal).

A tenth embodiment of the video memory arrangement in accordance with the invention is characterised, in that the second address generating means comprise fourth calculating means which are provided with a first input for receiving the load value signal, a second input for receiving a third margin signal, and an output coupled to the still further first input of the still further selecting means for generating the still further load value signal which corresponds with the load value signal minus the third margin signal and modulo the memory size signal, with the further selecting signal corresponding with the load control signal.

By using the fourth calculating means, the read signal is equalised to the write signal minus the third margin signal, so that the first address means and the second address means, having only the third margin signal as mutual distance, read and write respectively.

An eleventh embodiment of the video memory arrangement in accordance with invention is characterised, in that the second address generating means comprise further comparing means which are provided with a first input for receiving the read signal, a second input coupled to the output of the third forward calculating means for receiving the maximum address value signal, and an output for generating a further output signal of one type in case of inequality, and for generating a further output signal of other type in case of equality, with the second address generating means comprising further combining means which are provided with a first input coupled to the output of the further comparing means, a second input for receiving a further control signal, and an output coupled to the further counting control input of the further counting means for supplying, in response to the further output signal of one type, the further control signal to the further counting control input of the further counting means and for blocking, in response to the further output signal of other type, said further control signal.

By using the further comparing means and the further combining means, it is prevented that a read address and a write address will coincide.

REFERENCES

NL 9401301 (Dutch priority application)

All references are considered to be incorporated in this patent application.

EXEMPLARY EMBODIMENT

The invention will now be described in further detail with reference to an exemplary embodiment represented in the Figures, showing FIG. 1 a video memory arrangement according to the invention, comprising a non-mechanical memory and first and second address generating means, and FIG. 2 the second address generating means for use in the video memory arrangement according to the invention.

The video memory arrangement according to the invention as represented in FIG. 1 comprises a non-mechanical memory 1, first address generating means 2 and second address generating means 3. The non-mechanical memory 1 for instance is a Dual Ported Random Access Memory, or DPRAM, which is provided with a data input 10 for receiving a digital video signal 80, and which is provided with a data output 13 for generating a digital video signal 81. Furthermore, the DPRAM 1 is provided with an address input 11, 12, which comprises a first address input 11 for receiving a write signal 92 originating from first address generating means 2, and which comprises a second address input 12 for receiving a read signal 93 originating from second address generating means 3.

First addressing means 2 are, for example, provided with counting means which comprise a counting control input 20 for receiving a control signal 90 which is to be derived from the digital video signal which is to be received, and which counting means comprise a load control input 21 for receiving a load control signal 91. Furthermore, counting means 2 are provided with a load value input 22 for receiving a load value signal 100 and a write signal output 23 for generating the write signal 92.

Second address generating means 3 comprise thirteen inputs 30–42, of which input 30 serves for receiving a further control signal 94, input 31 serves for receiving a selecting signal 95, input 33 serves for receiving a further selecting signal which e.g. corresponds with the load control signal 91, input 34 serves for receiving the write signal 92, input 32 serves for receiving a still further selecting signal 96, input 35 serves for receiving a signal which e.g. corresponds with the load value signal 100, input 36 serves for receiving a first margin signal 101, input 37 serves for receiving a second margin signal 102, input 38 serves for receiving a third margin signal 103, input 39 serves for receiving a fourth margin signal 104, input 40 serves for receiving a memory size signal 105, input 41 serves for receiving a forward jump size signal 106, and input 42 serves for receiving a backward jump size signal 107. Furthermore, second address generating means 3 are provided with a read signal output 43 for generating the read signal 93.

Figure 2:
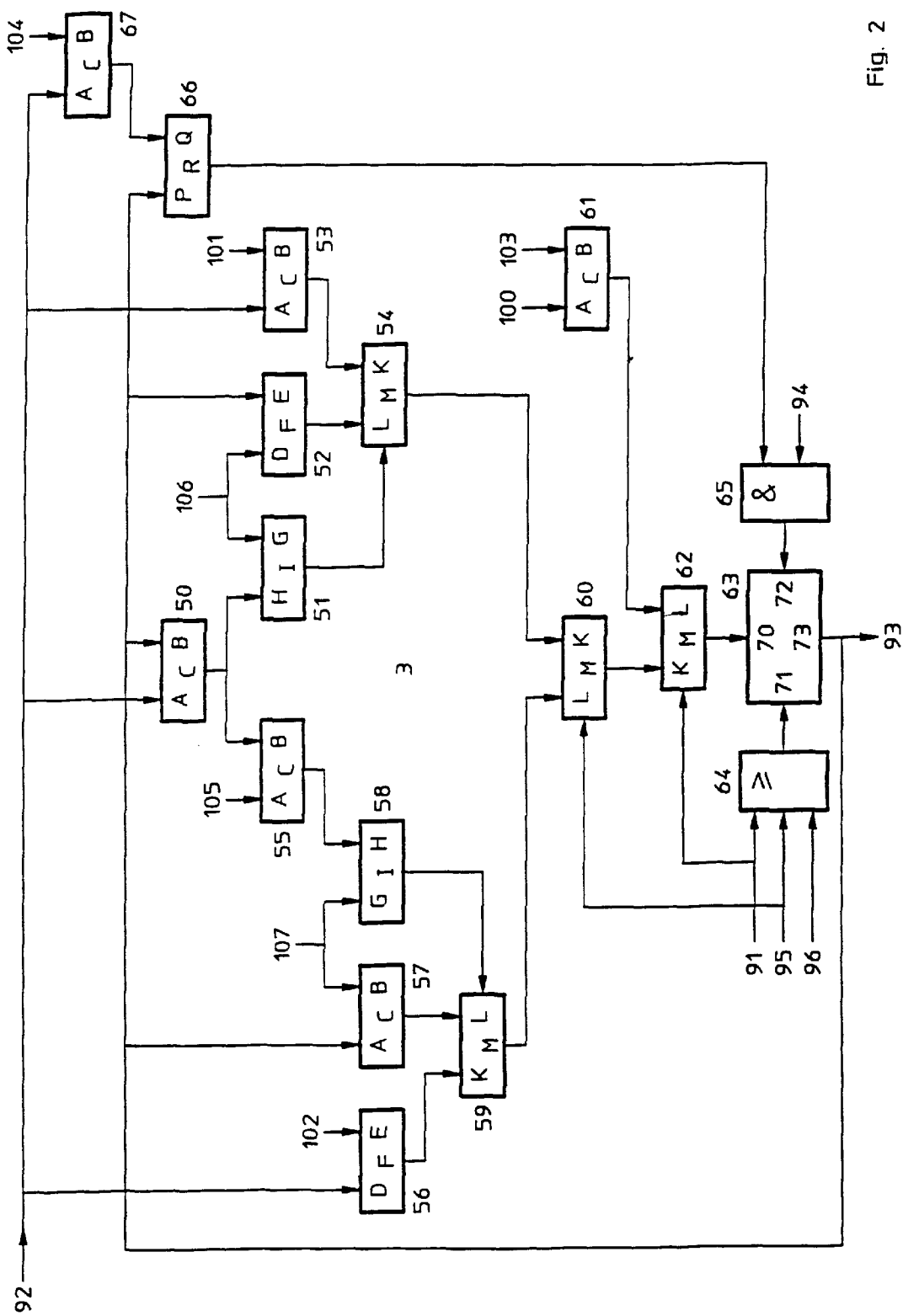

The second address generating means 3, as represented in FIG. 2, comprise determining means 50–59 for determining a permitted address jump. To this end, the determining means 50–59 comprise first forward calculating means 50 and first backward calculating means 55 for calculating an available address space, second forward calculating means 52 and second backward calculating means 57 for calculating a desired address jump, third forward calculating means 53 and third backward calculating means 56 for calculating an extreme address value, forward comparing means 51 for generating a forward output signal and backward comparing means 58 for generating a backward output signal, and forward multiplexing means 54 functioning as selecting means and backward multiplexing means 59 functioning as selecting means; both multiplexing means each for selecting the desired address jump or the extreme address value as a permitted address jump.

First forward calculating means 50 dispose over an A-input for receiving the write signal 92, and over a B-input for receiving the read signal 93, and over a C-output for generating a forward address space signal which corresponds with the write signal 92 minus the read signal 93 and modulo the memory size signal 105, which memory size signal 105 is to be disclosed either by adjusting or by supplying to first forward calculating means 50. First backward calculating means 55 dispose over an A-input for receiving the memory size signal 105 and over a B-input for receiving the forward address space signal, and over a C-output for generating a backward address space signal which corresponds with the memory size signal 105 minus the forward address space signal (and modulo the memory size signal 105, which however is superfluous as a consequence of the memory size signal 105 always being larger than the forward address space signal).

Second forward calculating means 52 dispose over a D-input for receiving the forward jump size signal 106 and an E-input for receiving the read signal 93 and over an F-output for generating a first forward address jump signal which corresponds with the forward jump size signal 106 plus the read signal 93 and modulo the memory size signal 105, which memory size signal 105 therefore either has to be disclosed by adjusting or by supplying to second calculating means 52. Second backward calculating means 57 dispose over an A-input for receiving the read signal 93 and over a B-input for receiving the backward jump size signal 107 and over a C-output for generating a first backward address jump signal which corresponds with the read signal 93 minus the backward jump size signal 107 and modulo the memory size signal 105, which memory size signal 105 therefore either has to be disclosed by adjusting or by supplying to second backward calculating means 57.

Third forward calculating means 53 dispose over an A-input for receiving the write signal 92 and over a B-input for receiving the first margin signal 101 and over a C-output for generating a maximum address value signal which corresponds with the write signal 93 minus the first margin signal 101 and modulo the memory size signal 105, which memory size signal 105 therefore either has to be disclosed by adjusting or by supplying to third forward calculating means 53. Third backward calculating means 56 dispose over a D-input for receiving the write signal 92 and over an E-input for receiving the second margin signal 102 and over an F-output for generating a minimal address value signal which corresponds with the write signal 92 plus the second margin signal 102 and modulo the memory size signal 105, which memory size signal 105 therefore either has to be disclosed by adjusting or by supplying to third backward calculating means 56.

Forward comparing means 51 dispose over a G-input for receiving the forward jump size signal 106 and over an H-input for receiving the forward address space signal and over an I-output for generating a forward output signal of one type if the forward jump size signal 106 is larger than or equal to the forward address space signal, and for generating a forward output signal of other type in other cases. Backward comparing means 58 dispose over a G-input for receiving the backward jump size signal 107 and over an H-input for receiving the backward address space signal and over an I-output for generating a backward output signal of one type if the backward jump size signal 107 is larger than or equal to the backward address space signal, and for generating a backward output signal of other type in other cases.

Forward multiplexing means 54 dispose over a K-input for receiving the maximum address value signal and over an L-input for receiving the first forward address jump signal and over an M-output for generating, in response to the forward output signal, a second forward address jump signal which corresponds with the maximum address value signal in case of a forward output signal of one type and with the first forward address jump signal in case of a forward output signal of other type. Backward multiplexing means 59 dispose over a K-input for receiving the minimum address value signal and over an L-input for receiving the first backward address jump signal and over an M-output for generating, in response to the backward output signal, a second backward address jump signal which corresponds with the minimum address value signal in case of a backward output signal of one type and with the first backward address jump signal in case of a backward output signal of other type.

The address generating means 3, as represented in FIG. 2, furthermore are provided with further selecting means 60 which dispose over a K-input for receiving the second forward address jump signal, and over an L-input for receiving the second backward address jump signal, and over an M-output for generating, in response to the selecting signal 95, the second forward address jump signal in case of the selecting signal of one type, and for generating the second backward address jump signal in case of the selecting signal of other type.

The second address generating means 3, as represented in FIG. 2, are still further provided with fourth calculating means 61 which dispose over an A-input for receiving the signal which e.g. corresponds with the load value signal 100, and over a B-input for receiving the third margin signal 103, and over a C-input for generating a still further load value signal which corresponds with the load value signal 100 minus the third margin signal 103 and modulo the memory size signal 105, which memory size signal 105 therefore either has to be disclosed by adjusting or by supplying to fourth calculating means 61. Furthermore, second address generating means 3 are provided with still further selecting means 62 which dispose over a K-input for receiving the second forward or backward address jump signal and over an L-input for receiving the still further load value signal and over an M-output for generating, in response to the further selecting signal which, for example, corresponds with load control signal 91, a still further load control value which corresponds with the second forward or backward address jump signal in case of the further selecting signal of one type and which corresponds with the still further load value signal in case of the further selecting signal of other type.

The second address generating means 3, as represented in FIG. 2, are also provided with fifth calculating means 67 which dispose over an A-input for receiving the write signal 92, and over a B-input for receiving the fourth margin signal 104, and over a C-output for generating a calculating means output signal which corresponds with the write signal 92 minus the fourth margin signal 104 and modulo the memory size signal 105, which memory size signal 105 therefore either has to be disclosed by adjusting or by supplying to fifth calculating means 67. If the third and the fourth margin signal mutually correspond, the third forward calculating means 53 and the fifth calculating means 67 can of course completely coincide. Furthermore, second address generating means 3 are provided with further comparing means 66 which dispose over a P-input for receiving the read signal 93 and over a Q-input for receiving the calculating means output signal, and over an R-output for generating a further output signal of one type in case of inequality and for generating a further output signal of other type in case of equality.

The address generating means 3, as represented in FIG. 2, are also provided with further counting means 63 which dispose over a further output 73 for generating a subsequent read signal, over a further counting control input 72 for receiving a further counting control signal and for modifying, in response to the further counting control signal, a counting position and supplying the modified counting position to the further output, over a further load control input 71 for receiving a further load control signal, and over a further load value input 70 for receiving a further load value signal and for loading, in response to the further load control signal, the further counting means 63 with said further load value signal, and supplying to the further output 73 said further load value signal. The further output 73 is coupled to the A-input of second backward calculating means 57, to the B-input of first forward calculating means 50, to the E-input of second forward calculating means 52 and to the P-input of further comparing means 66, and the further load value input 70 is coupled to the M-output of still further selecting means 62. The further load control input 71 is coupled to an output of combining means 64 (OR function), which dispose over a first input for receiving the selecting signal 95, over a second input for receiving the further selecting signal 91, which for example corresponds with the load control signal, and over a third input for receiving a still further selecting signal 96. The further counting control input 72 is coupled to an output of further combining means 65 (AND function), which dispose over a first input coupled to the R-output of further comparing means 66 for receiving the further output signal, and over a second input for receiving a further control signal 94 which in case of a further output signal of one type is supplied to further counting means 63, and which in case of a further output signal of other type is not supplied to further counting means 63 but is blocked.

The video memory arrangement in accordance with the invention for example functions as follows, in which case for the sake of clarity it will be assumed that the non-mechanical memory 1 consists of 512 locations which are to be addressed. The memory size signal 105 therefore has the value 512 then. Furthermore, it will be assumed that all margin signals 101, 102, 103, 104, each have the value 1. Before a digital video signal 80 has to be stored, counting means 2 and further counting means 63 are resetted, by supplying a load value signal 100 which, for example, has the value 1 to counting means 2 and to fourth counting means 61, and by supplying a load control signal 91 of other type (logic one) to counting means 2 and to combining means 64 and to still further selecting means 62. As a consequence thereof, counting means 2 are loaded with the value 1 and they generate a write signal which has the value 1, as a consequence of which, the relevant part of the digital video signal 80 is stored at location 1 in the non-mechanical memory 1, and further counting means 63 are loaded with the value 0 via the still further selecting means 62 and the fourth calculating means 61 (the third margin signal 103 has the value 1) and they generate a read signal which has the value 0.

From the digital video signal 80 which is to be received and which is to be stored, a control signal 90 is derived in a manner known by those skilled in the art, which control signal 90 is supplied to counting control input 20, and counting means 2, in response thereto, raise their counting value by the value 1 and therefore generate a write signal 92 which has the value 2. As a consequence thereof, the relevant part of the digital video signal 80 is stored at location 2 in the non-mechanical memory 1. Then, a further control signal 94 is generated, for example, by deriving this from the control signal 90 or via a pulse generator not shown in the Figures which can possibly be provided with a Phase Locked Loop function. As a consequence of further comparing means 66 detecting an inequality between the write signal 92 which has the value 2 minus the value 1 on the one hand, and the read signal 93 which has the value 0 on the other hand, the further control signal 94 is supplied via further combining means 65 to further counting means 63 which in response thereto raise their counting position by the value 1 and therefore generate a subsequent read signal 93 which has the value 1. As a consequence thereof, the part of the digital video signal which is stored at the location 1 of the non-mechanical memory 1, is supplied to data output 13 and generated as a digital video signal 81. In response to a subsequent control signal 90 which is supplied to counting control input 20, counting means 2 raise their counting position by the value 1 and they generate a write signal 92 which has the value 3. As a consequence thereof, the relevant part of the digital video signal 80 at location 3 is stored at location 3 in the non-mechanical memory 1. Then, a subsequent further control signal 94 is generated. As a consequence of further comparing means 66 detecting an inequality between the write signal 92 which has the value 3 minus the value 1 on the one hand, and the read signal 93 which has the value 1 on the other hand, the further control signal 94 is supplied via further combining means 65 to further counting means 63 which in response thereto raise their counting position by the value 1 and therefore generate a subsequent read signal 93 which has the value 2. As a consequence thereof, the part stored at the location 2 of the non-mechanical memory 1 of the digital video signal is supplied to data output 13 and generated as a digital video signal 81, etc. In this manner a digital video signal 80 which is to be supplied to data input 10 is stored in non-mechanical memory 1 at the successive locations 1,2,3 etc, and the digital video signal stored at said successive locations 1,2,3 is read out and generated as a digital video signal 81. Counting means 2 and further counting means 63 each possess a maximum counting position which has the value 511, and the subsequent counting position possesses the value 0. As a result of this, after all 512 different locations in the non-mechanical memory have been written with parts of the digital video signal 80, the part which is situated at the oldest location (in the above-mentioned example location 1) of the digital video signal 80 is overwritten, etc.

Such a video memory arrangement could, for example, be used in a video monitoring system in a petrol station, in which case a camera which would constantly monitor a certain area or room, would generate analogue or digital video signals and would supply these to a video coding device, which would convert said analogue or digital video signals into coded digital video signals which would be stored in the video memory arrangement via the write signal and which would be generated via the read signal by the video memory arrangement for supply to a display screen. As only seldom a calamity will occur, said stored digital video signals need not be stored forever but can be overwritten after a certain period. As soon as a calamity occurs, an analogue (for example by using modems) or digital communication connection is set up with, for example, a radio control room for the transport of the coded digital video signals, in which radio control room staff is of course not only interested the present video signals but also in the video signals stored previously. To this end, regulating signals have to be transmitted from the radio control room to the video monitoring system via the same communication connection or via another communication connection. It must furthermore be possible to stop after some time or immediately, from the side of the radio control room via further regulating signals, the storage of digital video signals in order to prevent that relevant video signals, with for example portraits of the perpetrators, are being overwritten. In this case it becomes possible, even in case a write signal has been stopped, to follow (in a remote manner) the life signals by bridging the video memory arrangement. Said bridging could be accomplished via still further regulating signals from the radio control room. Another use of the video memory arrangement in accordance with the invention is installing it in a television receiver for receiving digital video images so that life broadcasts can be watched after some time in a not-life manner and/or life broadcasts can be stopped temporarily without subsequently having to miss a part, and/or parts of life broadcasts being repeated with the subsequent possibility of further watching in a not-life manner or jumping forward back to the life moment.

Watching present video signals and video signals stored some time ago, while constantly storing video signals in a normal manner, occurs in the following way. Suppose, the write signal 92 possesses at a given moment when a calamity occurs the value 302 and the read signal 93 possesses the value 300. When one is interested in video signals stored some time ago, the backward jump size signal 107 for example obtains the value 50. Furthermore, the selecting signal 95 obtains the value logic one (selecting signal of other type), the further selecting signal 91 (load control signal) obtains the value logic zero (further selecting signal of one type), and the still further selecting signal 96 obtains the value logic zero (still further selecting signal of one type). As a consequence thereof, via the further load control signal which has the value logic one (further load control signal of one type) and which originates (via further selecting means 60 and via the still further selecting means 62) from combining means 64, further counting means 63 are loaded with the second backward address jump signal which originates from the backward multiplexing means 59. This second backward address jump signal possesses the value 250, through the fact that the second backward calculating means 57 generate the first backward address jump signal which corresponds with the read signal 93 minus the backward jump size signal 107 and modulo the memory size signal 105 which therefore possesses the value 250. The backward comparing means 58 generate the backward output signal of other type (logic one) through the fact that the backward jump size signal 107 which possesses the value 50 is smaller than the backward address space signal which possesses the value 512−2=510, and, in response thereto, backward multiplexing means 59 couple their L-input to their M-output. In this manner, a subsequent read signal 93 is therefore generated which has the value 250, and as a consequence thereof, the part of the video signal is read out which is situated at location 250 of the non-mechanical memory 1. By supplying the further control signal 94, this read signal can subsequently be increased, and as a consequence thereof, video information stored some time back in the past can now be watched. In this context, the fifth calculating means 67 and the further comparing means 66 and the further combining means 65 prevent that, in case the write signal 92 is no longer increased, the read signal 93, due to the fact of itself being constantly increased via the further counting means 63, could at a given moment pass said stopped write signal 92.

Suppose, the write signal 92 then possesses the value 312 and the read signal 93 possesses the value 250. When one is again interested in video signals stored some time ago, the backward jump size signal 107, for example, again obtains the value 50. Furthermore, the selecting signal 95 obtains the value logic one (selecting signal of other type), the further selecting signal 91 (the load control signal) obtains the value logic zero (further selecting signal of one type), and the still further selecting signal 96 obtains the value logic zero (still further selecting signal of one type). As a consequence thereof, via the further load control signal which has the value logic one (further load control signal of other type) and which originates (via the further selecting means 60 and via the still further selecting means 62) from combining means 64, further counting means 63 are loaded with the second backward address jump signal which originates from backward multiplexing means 59. This second backward address jump signal possesses the value 200 through the fact that the second backward calculating means 57 generate the first backward address jump signal which corresponds with the read signal 93 minus the backward jump size signal 107 and modulo the memory size signal 105 and which therefore possesses the value 200. The backward comparing means 58 generate the backward output signal of other type (logic one) through the fact that the backward jump size signal 107 which possesses the value 50 is smaller is than the backward address space signal which possesses the value 512−62=450, and in response thereto multiplexing means 59 couple their L-input to their M-output. In this manner, a subsequent read signal 93 is therefore generated which has the value 200, and as a consequence thereof, the part of the digital video signal is read out which is situated at location 200 of the non-mechanical memory 1.

Suppose the write signal 92 then possesses the value 322 and the read signal 93 possesses the value 200. When one is again interested in video signals stored some time ago, the backward jump size signal 107, for example, obtains the value 400. Furthermore, the selecting signal 95 obtains the value logic one (selecting signal of other type), the further selecting signal 91 (the load control signal) obtains the value logic zero (further selecting signal of one type), and the still further selecting signal 96 obtains the value logic zero (still further selecting signal of one type). As a consequence thereof, via the further load control signal which has the value logic one (further logic load control signal of other type) and which originates (via the further selecting means 60 and via the still further selecting means 62) from combining means 64, further counting means 63 are loaded with the second backward address jump signal which originates from the backward multiplexing means 59. This second backward address jump signal possesses the value 323 through the fact that the third backward calculating means 56 generate a minimum address value signal which corresponds with the write signal 92 plus the second margin signal 102 and modulo the memory size signal 105 and which therefore possesses the value 323. The backward comparing means 58 generate the backward output signal of one type through the fact that the backward jump size signal 107 which possesses the value 400 is larger than the backward address space signal which possesses the value 512−122=390, and in response thereto backward multiplexing means 59 couple their K-input to their M-output. In this manner, a subsequent read signal 93 is therefore generated which has the value 323, and as a consequence thereof, the part of the digital video signal is read out which is situated at location 323 of the non-mechanical memory 1. By using the video memory arrangement in accordance with the invention, in this case it is therefore prevented that, when jumping backward, the read signal 93 would unjustly pass the write signal 92.

The above-mentioned example with backward jumps both applies in case that the write signal 92 is increased regularly, in response to the control signal 90 (whereby new digital video signals are being stored), and in case the write signal 92 is stopped (whereby new digital video signals are no longer being stored). In a manner corresponding thereto and illustrated below, by using the video memory arrangement in accordance with the invention, it is prevented that, when jumping forward, the read signal 93 would unjustly pass the write signal 92, whereby, by using the fifth calculating means 67 and the further comparing means 66 and the further combining means 65, it is prevented that in case the write signal 92 is no longer increased, the read signal 93, due to the fact of itself being constantly increased via further counting means 63, could pass said stopped write signal 92 at a given moment.

Suppose the write signal 92 subsequently possesses the value 335, and the read signal 93 possesses the value 210. In case one is interested in video signals stored more recently, the forward jump size signal 106, for example, obtains the value 100. Furthermore, the selecting signal 95 obtains the value logic zero (selecting signal of one type), the further selecting signal 91 (the load control signal) obtains the value logic zero (further selecting signal of one type), and the still further selecting signal 96 obtains the value logic one (still further selecting signal of other type). As a consequence thereof, via the further load control signal which has the value logic one (further load control signal of other type) and which originates (via the further selecting means 60 and via the still further selecting means 62) from combining means 64, further counting means 63 are loaded with the second forward address jump signal which originates from backward multiplexing means 54. This second forward address jump signal possesses the value 310 through the fact that the second forward calculating means 52 generate the first forward address jump signal which corresponds with the read signal 93 plus the forward jump size signal 106 and modulo the memory size signal 105 and which therefore possesses the value 310. The forward comparing means 51 generate the forward output signal of other type (logic one) through the fact that the forward jump size signal 106 which possesses the value 100 is smaller than the forward address space signal which possesses the value 335−210=125, and in response thereto forward multiplexing means 54 couple their K-input to their M-output. In this manner, a subsequent read signal 93 is therefore generated which has the value 310, and as a consequence thereof, the part of the digital video signal is read out which is situated in location 310 of the non-mechanical memory 1.

Suppose the write signal 92 subsequently possesses the value 345 and the read signal 93 possesses the value 318. In case one is again interested in video signals stored more recently, the forward jump size signal 106, for example, again obtains the value 100. Furthermore, the selecting signal 95 obtains the value logic zero (selecting signal of one type), the further selecting signal 91 (the load control signal) obtains the value logic zero (further selecting signal of one type) and the still further selecting signal 96 obtains the value logic one (still further selecting signal of other type). As a consequence thereof, via the further load control signal which has the value logic one (further load control signal of other type) and which originates (via further selecting means 60 and via still further selecting means 62) from combining means 64, further counting means 63 are loaded with the second forward address jump signal which originates from backward multiplexing means 54. This second forward address jump signal possesses the value 344 through the fact that the second forward calculating means 53 generate a maximum address value signal which corresponds with the read signal 92 minus the first margin signal 101 and modulo the memory size signal 105 and which therefore possesses the value 344. The forward comparing means 51 generate the forward output signal of one type through the fact that the forward jump size signal 106 which possesses the value 100 is larger than the forward address space signal which possesses the value 345−318=27, and in response thereto forward multiplexing means 54 couple their K-input to their M-output. In this manner, a subsequent read signal 93 is therefore generated which has the value 344, and as a consequence thereof, the part of the digital video signal is read out which is situated in location 344 of the non-mechanical memory 1. By using the video memory arrangement in accordance with the invention, in this case it is therefore prevented that, when jumping forward, the read signal 93 would unjustly pass the write signal 92.

The above-mentioned example with forward jumps both applies in case the write signal 92 is increased regularly, in response to the control signal 90 (whereby new digital video signals are being stored), and in case the write signal 92 is stopped (whereby new video signals are no longer being stored). By using the fifth calculating means 67 and the further comparing means 66 and the further combining means 65, it is again prevented that, in case the write signal is no longer increased, the read signal 93, due to the fact of itself being constantly increased via further counting means 63, could at a given moment, pass said stopped write signal 92.

The calculating means 50, 53, 55, 57 and 67 could be realised in hardware form in a manner known by those skilled in the art by supplying the signal at the A-input and the signal at the B-input to a known substraction circuit, and by supplying the result to a comparator circuit, which in case a certain threshold is not reached, increases the result with the memory size signal via a known adding circuit. The calculating means 52 and 56 could be realised in hardware form in a manner known by those skilled in the art by supplying the signal to the D-input and the signal to the E-input to a known adding circuit, and by supplying the result to a comparator circuit which, in case of transgressing a certain other threshold, decreases the result with the memory size signal via a known substraction circuit.

The first and second address generating means could, for example, be realised in software form in the following manner:

10 forwardspace: =(write−read)mod memsize
20 forwardaddress2: =(read+forwardstep)mod memsize
30 maximumaddress:=(write−margin1)mod memsize
40 if forwardstep≧forwardspace then forwardaddress2: =maximumaddress else forwardaddress2: =forwardaddress1
50 backwardspace: =memsize−forwardspace
60 backwardaddress1: =(read−backwardstep)mod memsize
70 minimumaddress: =(write+margin2)mod memsize
80 if backwardstep≧backwardspace then backwardaddress2: =minimumaddress else backwardaddress2: =backwardaddress1
90 if stepbackward=true then loadvalue1: =backwardaddress2 else loadvalue1: =forwardaddress2
100 readcounterloadvalue: =(readwritecounterloadvalue−margin3) mod memsize
110 if loadreadwritecounter=true then loadvalue2: =readcounterloadvalue else loadvalue2: =loadvalue1
120 if stepbackward=true or stepforward true or loadreadwritecounter=true then loadreadcounter=true else loadreadcounter=false
130 if (write−margin4) mod memsize=read then readallowed=false else readallowed=true
140 if readcountenable=true and readallowed=true then combinedreadcountenable=true else combinedreadcountenable=false
150 if loadreadcounter=true then read: =loadvalue2 else if combinedreadcountenable=true then read: =(read+1)mod memsize else read: =read
160 if loadreadwritecounter=true then write: =readwritecounterloadvalue else if writecountenable=true then write: =(write+1)mod memsize else write: =write In this context, line 10 corresponds with first forward calculating means 50, line 20 corresponds with second forward calculating means 52, line 30 corresponds with third forward calculating means 53, line 40 corresponds with forward comparing means 51 and forward multiplexing means 54, line 50 corresponds with first backward calculating means 55, line 60 corresponds with second backward calculating means 57, line 70 corresponds with third backward calculating means 56, line 80 corresponds with backward comparing means 58 and backward multiplexing means 59, line 90 corresponds with further selecting means 60, line 100 corresponds with fourth calculating means 61, line 110 corresponds with still further selecting means 62, line 120 corresponds with combining means 64, line 130 corresponds with fifth calculating means 67 and further comparing means 66, line 140 corresponds with further combining means 65, line 150 corresponds with further counting means 63, and line 160 corresponds with counting means 2. The modulo function in a line "result mod memsize" in this context can be realised in a software manner known by those skilled in the art, by detecting if the threshold value 0 is not reached and in that case adding the value "memsize" (512) to the result and by detecting a transgression of the other threshold "memsize-1" (511) and in this case subtracting the value "memsize" (512) from the result.

What is claimed is:

1. A video memory system, comprising:
 a non-mechanical memory including:
  a data input for receiving a digital video signal,
  a data output for generating a digital video signal, and
  an address input for
   receiving a write signal for addressing a write location for the digital video signal to be received via the data input, and
   receiving a read signal for addressing a read location for the digital video signal which is to be generated via the data output,
 first address generating means coupled to the address input for generating the write signal, in response to at least one control signal which is to be derived from the digital video signal which is to be received, and
 second address generating means coupled to the address input for generating the read signal, in response to at least the write signal, the second address generating means including:
  determining means for determining, in response to at least the write signal and the read signal, a permitted address jump, the determining means including:
   first calculating means for calculating, in response to at least the write signal and the read signal, an available address space,
   second calculating means for calculating, in response to at least the read signal, a desired address jump,
   third calculating means for calculating, in response to at least the write signal, an extreme address value, and selecting means for selecting, in dependence of at least the available address space, the desired address jump or the extreme address value as a permitted address jump, the first calculating means including:
first forward calculating means which are provided with
a first input for receiving the write signal,
a second input for receiving the read signal, and
an output for generating a forward address space signal which corresponds with the write signal minus the read signal and modulo a memory size signal, the second calculating means including
second forward calculating means which are provided with
a first input for receiving the read signal,
a second input for receiving a forward jump size signal, and
an output for generating a first forward address jump signal which corresponds with the read signal plus the forward jump size signal modulo the memory size signal, the third calculating means including
third forward calculating means which are provided with
a first input for receiving the write signal,
a second input for receiving a first margin signal, and
an output for generating a maximum address value signal which corresponds with the write signal minus the first margin signal and modulo the memory size signal, the determining means further comprising forward comparing means which are provided with
a first input for receiving the forward jump size signal,
a second input for receiving the forward address space signal, and
an output for generating a forward output signal of one type if the forward jump size signal is larger than or equal to the forward address space signal and for generating a forward output signal of other type in other cases, and the selecting means including
forward multiplexing means which are provided with
a control input for receiving the forward output signal of one type or of other type,
a first input for receiving the first forward address jump signal,
a second input for receiving the maximum address value signal, and
an output for generating a second forward address jump signal.

2. The system of claim 1, wherein
the first calculating means include first backward calculating means which are provided with
a first input for receiving the memory size signal,
a second input for receiving the forward address space signal, and
an output for generating a backward address space signal which corresponds with the memory size signal minus the forward address space signal,
the second calculating means comprising second backward calculating means which are provided with
a first input for receiving the read signal,
a second input for receiving a backward jump size signal, and
an output for generating a first backward address jump signal which corresponds with the read signal minus the backward jump size signal modulo the memory size signal,
the third calculating means comprising third backward calculating means which are provided with
a first input for receiving the write signal,
a second input for receiving a second margin signal, and
an output for generating a minimum address value signal which corresponds with the write signal plus the second margin signal and modulo the memory size signal,
the determining means further comprising backward comparing means which are provided with
a first input for receiving the backward jump size signal,
a second input for receiving the backward address space signal, and
an output for generating a backward output signal of one type if the backward jump size signal is larger than or equal to the backward address space signal and for generating a backward output signal of other type in other cases,
the selecting means further comprising backward multiplexing means which are provided with
a control input for receiving the backward output signal of one type or of other type,
a first input for receiving the first backward address jump signal,
a second input for receiving the minimum address value signal, and
an output for generating a second backward address jump signal, and,
the determining means still further comprising further selecting means which are provided with
a further control input for receiving a selecting signal of one type or of other type,
a further first input for receiving the second forward address jump signal,
a further second input for receiving the second backward address jump signal, and
a further output for generating the second forward address jump signal, in response to the selecting signal of one type, and for generating the second backward address jump signal, in response to the selecting signal of other type.

3. The system of claim 1, wherein the second address generating means comprise further counting means which include
a further output for generating a subsequent read signal,
a further counting control input for receiving a further counting control signal and for modifying, in response to the further counting control signal, a counting position and supplying the modified counting position to the further output,
a further load control input for receiving a further load control signal,
a further load value input coupled to an output of at least one of the selecting means, for receiving a further load value signal and for loading, in response to the further load control signal, the further counting means with said further load value signal and supplying said further load value signal to the further output.

4. The system of claim 2, wherein the second address generating means comprise further counting means which include
- a further output for generating a subsequent read signal,
- a further counting control input for receiving a further counting control signal and for modifying, in response to the further counting control signal, a counting position and supplying the modified counting position to the further output,
- a further load control input for receiving a further load control signal,
- a further load value input coupled to an output of at least one of the selecting means, for receiving a further load value signal and for loading, in response to the further load control signal, the further counting means with said further load value signal and supplying said further load value signal to the further output.

5. A video memory system, comprising:
a non-mechanical memory including:
- a data input for receiving a digital video signal,
- a data output for generating a digital video signal, and
- an address input for receiving a write signal for addressing a write location for the digital video signal to be received via the data input, and receiving a read signal for addressing a read location for the digital video signal which is to be generated via the data output, first address generating means coupled to the address input for generating the write signal, in response to at least one control signal which is to be derived from the digital video signal which is to be received, and second address generating means coupled to the address input for generating the read signal, as a function of at least the write signal;

wherein the first address generating means are provided with counting means for generating in a cyclic manner subsequent counting values, said counting means including:
- a counting control input for receiving the control signal; and
- a load control input for receiving a load control signal for loading the counting means with a load value signal which is to be offered at a load value input of the counting means.

6. The system of claim 5, wherein the second address generating means include determining means for determining, in response to at least the write signal and the read signal, a permitted address jump.

7. A video memory system, comprising:
a non-mechanical memory including:
- a data input for receiving a digital video signal,
- a data output for generating a digital video signal, and
- an address input for receiving a write signal for addressing a write location for the digital video signal to be received via the data input, and receiving a read signal for addressing a read location for the digital video signal which is to be generated via the data output, first address generating means coupled to the address input for generating the write signal, in response to at least one control signal which is to be derived from the digital video signal which is to be received, and second address generating means coupled to the address input for generating the read signal, as a function of at least the write signal, wherein the second address generating means are provided with determining means for determining, in response to at least the write signal and the read signal, a permitted address jump, the determining means including:
- first calculating means for calculating, in response to at least the write signal and the read signal, an available address space,
- second calculating means for calculating, in response to at least the read signal, a desired address jump,
- third calculating means for calculating, in response to at least the write signal, an extreme address value, and
- selecting means for selecting, in dependence of at least the available address space, the desired address jump or the extreme address value as a permitted address jump.

8. The system of claim 7, wherein the second address generating means comprise further counting means which include
- a further output for generating a subsequent read signal,
- a further counting control input for receiving a further counting control signal and for modifying, in response to the further counting control signal, a counting position and supplying the modified counting position to the further output,
- a further load control input for receiving a further load control signal, a further load value input coupled to an output of at least one of the selecting means, for receiving a further load value signal and for loading, in response to the further load control signal, the further counting means with said further load value signal and supplying said further load value signal to the further output.

9. A video memory system, comprising:
a non-mechanical memory including:
- a data input for receiving a digital video signal,
- a data output for generating a digital video signal, and
- an address input for receiving a write signal for addressing a write location for the digital video signal to be received via the data input, and receiving a read signal for addressing a read location for the digital video signal which is to be generated via the data output, first address generating means coupled to the address input for generating the write signal, in response to at least one control signal which is to be derived from the digital video signal which is to be received, and second address generating means coupled to the address input for generating the read signal, as a function of at least the write signal, the second address generating means being provided with:
- determining means for determining, in response to at least the write signal and the read signal, a permitted address jump, and
- counting means which include
  - a further output for generating a subsequent read signal,
  - a further counting control input for receiving a further counting control signal and for modifying, in response to the further counting control signal, a counting position and supplying the modified counting position to the further output,
  - a further load control input for receiving a further load control signal, and
  - a further load value input coupled to an output of at least one of the selecting means, for receiving a further load value signal and for loading, in response to the further load control signal, the further counting means with said further load value signal and supplying said further load value signal to the further output.

10. The system of claim 9, wherein the second address generating means comprise still further selecting means which include a still further control input for receiving a further selecting signal of one type or of other type, a still further first input for receiving a still further load value signal, a still further second input coupled to the further output of the further selecting means, and a still further output coupled to the further load value input of the further counting means.

11. The system of claim 10, wherein the second address generating means include combining means which include an output for generating the further load control signal, a first input for receiving the selecting signal, a second input for receiving the further selecting signal, and a third input for receiving a still further selecting signal.

12. The system of claim 11, wherein the second address generating means comprise fourth calculating means which include a first input for receiving the load value signal, a second input for receiving a third margin signal, and an output coupled to the still further first input of the still further selecting means for generating the still further load value signal which corresponds with the load value signal minus the third margin signal and modulo the memory size signal, with the further selecting signal corresponding with the load control signal.

13. The system of claim 12, wherein the second address generating means comprise further comparing means which include a first input for receiving the read signal, a second input coupled to the output of the third forward calculating means for receiving the maximum address value signal, and an output for generating a further output signal of one type in case of inequality, and for generating a further output signal of other type in case of equality, with the second address generating means comprising further combining means which are provided with a first input coupled to the output of the further comparing means, a second input for receiving a further control signal, and an output coupled to the further counting control input of the further counting means for supplying, in response to the further output signal of one type, the further control signal to the further counting control input of the further counting means and for blocking, in response to the further output signal of other type, said further control signal.

\* \* \* \* \*